US007113425B2

(12) United States Patent　　　　　　　　　(10) Patent No.:　　US 7,113,425 B2
　　　Cho et al.　　　　　　　　　　　　　　　(45) Date of Patent:　　　Sep. 26, 2006

(54) NONVOLATILE SEMICONDUCTOR MEMORY DEVICE WITH SCALABLE TWO TRANSISTOR MEMORY CELLS

(75) Inventors: Woo-Yeong Cho, Gyeonggi-do (KR); Byung-Gil Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/976,626

(22) Filed: Oct. 29, 2004

(65) Prior Publication Data

US 2005/0146929 A1　　Jul. 7, 2005

(30) Foreign Application Priority Data

Jan. 6, 2004　　(KR) ...................... 10-2004-0000603

(51) Int. Cl.
　　*G11C 11/34*　　(2006.01)
　　*G11C 16/04*　　(2006.01)
(52) U.S. Cl. ................................. 365/177; 365/185.11
(58) Field of Classification Search ................ 365/177, 365/185.11
See application file for complete search history.

(56) References Cited

U.S. PATENT DOCUMENTS

| 5,896,327 | A | * | 4/1999 | Yang ........................... 365/200 |
| 5,952,692 | A | | 9/1999 | Nakazato et al. |
| 6,710,465 | B1 | * | 3/2004 | Song et al. .................. 257/316 |
| 6,757,196 | B1 | * | 6/2004 | Tsao et al. ............. 365/185.17 |
| 6,831,860 | B1 | * | 12/2004 | Lee et al. .............. 365/185.11 |
| 6,882,561 | B1 | * | 4/2005 | Kwon et al. ................ 365/149 |

* cited by examiner

*Primary Examiner*—Amir Zarabian
*Assistant Examiner*—Anthan Tran
(74) *Attorney, Agent, or Firm*—Marger Johnson & McCollom, P.C.

(57) ABSTRACT

A nonvolatile memory device includes a bit line, a pair of data lines and a plurality of scalable two transistor memory (STTM) cells. The memory cells are arranged between a pair of datalines so as to share the bit line. The memory device further includes a data line selection circuit and a sense amplification circuit. The data line selection circuit selects one of a pair of data lines, and the sense amplification circuit senses and amplifies a voltage difference between the bit line and the selected data line. Operation speed is increased, while improving device cell array structure.

17 Claims, 4 Drawing Sheets

NONVOLATILE SEMICONDUCTOR MEMORY DEVICE WITH SCALABLE TWO TRANSISTOR MEMORY CELLS

This application claims priority from Korean Patent Application No. 2004-00603, filed on Jan. 6, 2004, the contents of which is herein incorporated by reference in its entirety.

BACKGROUND OF THE INVENTION

1. Field of this Invention

This disclosure relates to semiconductor memory devices, and more particularly, to a nonvolatile semiconductor memory device with scalable two transistor memory (STTM) cells.

2. Description of the Related Art

Compared to other memory devices such as SRAM semiconductor devices, DRAM semiconductor devices have an advantage of being able to achieve a higher integration density. But DRAM semiconductor devices cannot maintain a stored charge, as required by scaling, due to leakage current from memory cells, internal noise, and soft errors caused by incident alpha particles. Therefore, the memory cells of such devices require constant refreshing in order to maintain stored data. Thus, power consumption is large even in stand-by mode.

ON the other hand, flash memory devices, or EEPROM devices, have a merit in that there is no need to refresh the memory cells in order to maintain data stored in the memory cells. However, a primary drawback of flash memory devices is that it is difficult to improve its relatively slow access time because it takes a relatively long time to program the memory cells. Moreover, a high voltage is necessary to program (write) or erase memory cells of flash memory devices. The high electric field applied during erase/write cycles degrades the SiO2 tunneling barrier to the floating gate over a predetermined number (typically about 105) of erase/write cycles and, as a result, limits the operational life of the memory device. Thus, there is a need for a novel memory cell device that combines the advantages of DRAM and flash memory. In other words, there is a need for a semiconductor memory device having memory cells that allow scalable memory charge relative to cell density of the device long-term retention, low voltage, high speed, and highly reliable operational characteristics. One such novel memory cell, which can be named as a Scalable Two-Transistor Memory cell, has been proposed by Nazato et al. (refer to IEDM 97, pp. 179–182 and U.S. Pat. No 5,952, 692). Nazato et al. referred to their device as a Planar Localized Electron Device Memory (PLEDM) cell. This memory cell has non-volatile, high-speed, very low-power dissipation, and high cell density characteristics. It also has an isolated memory node, which provides immunity against soft errors, and a gain property, which provides a large S/N ratio. It is a quantum tunneling device that works at room temperature with no hot carrier degradation effects, and can be fabricated by exsiting silicon processing technology. Using the STTM cell, the following invention discloses an improved cell array structure so that operation speed is increased.

SUMMARY OF THE INVENTION

Figure 1:
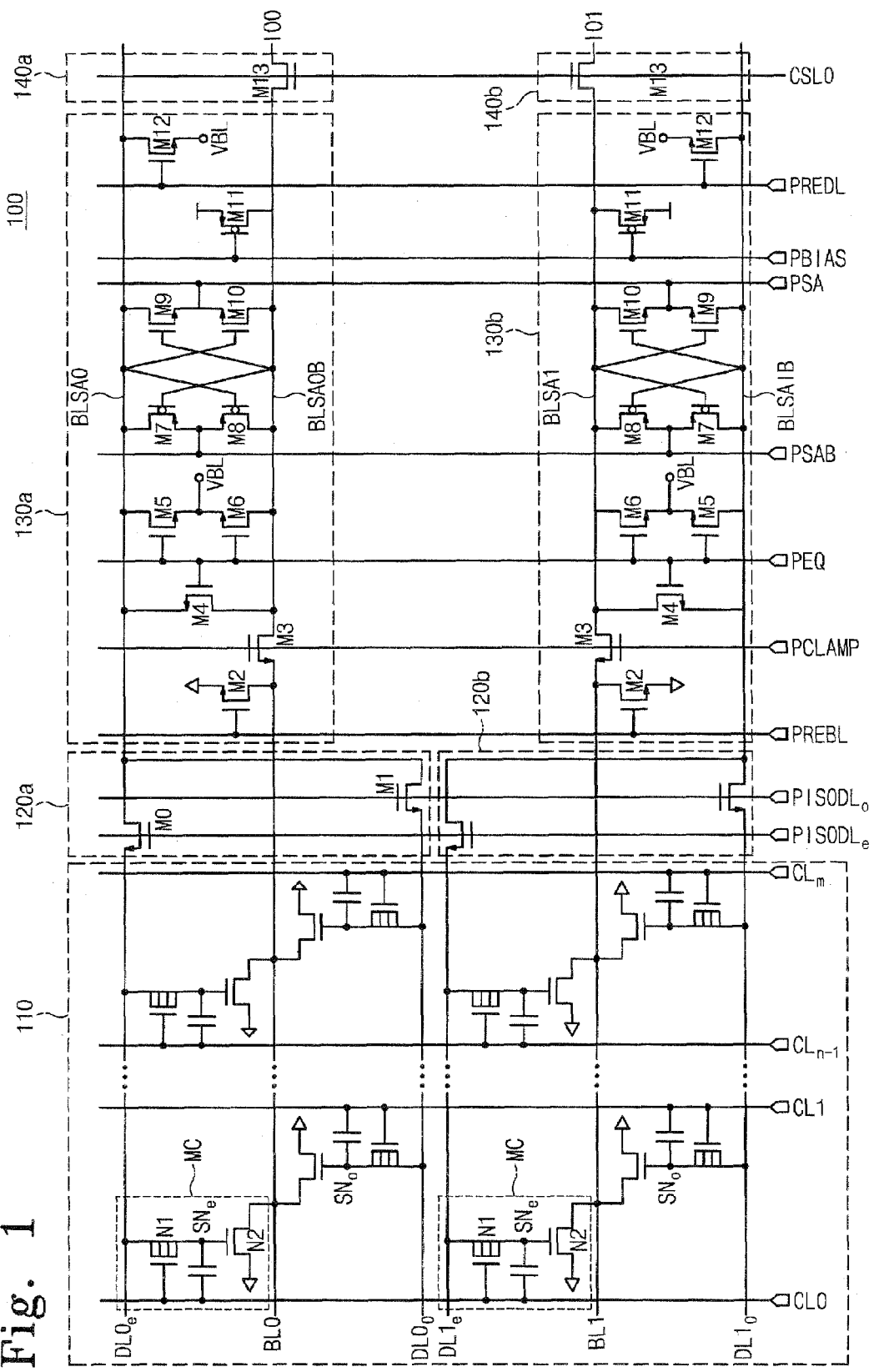
FIG. 1 is a circuit diagram of a nonvolatile memory device according to an embodiment of the invention.

One feature of the invention is to provide a non-volatile memory device operable at high speed.

Another feature of the invention is to provide a non-volatile memory device having an improved cell array structure.

Still other feature of the invention is to provide a non-volatile memory device capable of verifying a voltage distribution of a sense node in a STTM cell.

According to one feature of the invention, a non-volatile memory device comprises a bit line; first and second data lines; a first group of scalable two transistor memory (STTM) cells connected in parallel between the bit line and the first data line; and a second group of STTM cells connected in parallel between the bit line and the second data line.

In an exemplary embodiment, the memory device further includes a first group of control lines respectively connected to the STTM cells of the first group, and a second group of control lines respectively connected to the STTM cells of the second group. In this case, the control lines of the first and second groups are alternately arranged.

In an exemplary embodiment, the memory device further includes a selection circuit for selecting one of the first and second data lines in response to the control signals; and a sense amplification circuit for sensing and amplifying a voltage difference between the bit line and the selected data line.

In an exemplary embodiment, the sense amplification circuit senses data stored in a selected STTM cell and writes data to be written to the selected STTM cell in a write operation.

In an exemplary embodiment, the sense amplification circuit senses data stored in a selected STTM cell and outputs the sensed data to the outside in a read operation. And, the sensed data is outputted to the outside, and at the same time, is restored in the sensed data in the selected STTM cell.

In an exemplary embodiment, the sense amplification circuit supplies a bias current to the selected STTM cell in sensing data stored in a selected STTM cell.

In an exemplary embodiment, each of the STTM cells includes a read transistor and a write transistor. And, the sense amplification circuit includes a bias current supply part for supplying a bias current to the selected STTM cell in a read/write operation.

In an exemplary embodiment, bulk regions of read transistors in the STTM cells are electrically separated from a bulk region of the bias current supply part in the sense amplification circuit. The sense node voltage distribution of the STTM cells is verified by controlling a voltage applied to bulk regions of the read transistors of the STTM cells.

According to another feature of the invention, a nonvolatile memory device comprises a plurality of data line pairs; a plurality of bit lines arranged between each pair of data lines; a plurality of scalable two transistor memory (STTM) cells arranged so as to share a bit line arranged between each pair of data lines; a plurality of data line selectors corresponding to each pair of the data lines, each of the data line selectors selecting one data line among a corresponding data line pair; and a plurality of sense amplifiers each corresponding to the data line selectors, each of the sense amplifiers sensing and amplying a voltage difference between a data line selected by a corresponding data line selector and a corresponding bit line.

In an exemplary embodiment, STTM cells connected to each of the data line pairs are classified into a first group and a second group. The first group of STTM cells are respectively connected to control lines of the first group. The second group of STTM cells are respectively connected to control lines of the second group. The control lines of the first and second groups are alternately arranged.

In an exemplary embodiment, each of the sense amplifiers senses data stored in a selected STTM cell and then writes data to be written to the selected STTM cell in a write operation. Each of the sense amplifiers senses data stored in the selected STTM and outputs the sensed data to the outside. The sensed data is outputted to the outside, and at the same time, is restored in the selected STTM cell in a read operation. Each of the sense amplifiers supplies a bias current to the selected STTM cell in sensing data stored in the selected STTM cell.

In an exemplary embodiment, each of the STTM cells includes a read transistor and a write transistor. Each of the sense amplifiers includes a bias current supply part of supplying a bias current to the selected STTM cell in a read/write operation. Bulk regions of read transistors in the STTM cells are electrically separated from a bulk region of the bias current supply part of each of the sense amplifiers. The sense node voltage distribution of the STTM cells is verified by controlling a voltage applied to bulk regions of the read transistors of the STTM cells.

DETAILED DESCRIPTION OF THE PREFERRED EMBODIMENT

FIG. 1 is a circuit diagram showing a non-volatile memory device according to an embodiment of the invention.

Referring to FIG. 1, the non-volatile memory device includes a memory cell array 110. A plurality of STTM cells (or non-volatile memory cells) are arranged in a matrix format in the memory cell array 110. Each of the STTM cells MC comprises a write transistor (or a vertical transistor) N1 and a read transistor (or a sense transistor) N2. The memory cell array 110 includes a plurality of data lines, a plurality of bit lines and a plurality of control lines. As shown in FIG. 1, one bit line is shared by STTM cells in two columns. For instance, a bit line BL0 is shared by STTM cells connected to data lines DL0e and DL0o. A bit line BL1 is shared by STTM cells connected to data lines DL1e and DL1o. STTM cells connected to the data line DL0e and the bit line BL0 are connected to a control line CL0. STTM cells connected to the data line DL1e and the bit line BL1 are connected to a control line CL1. Similary, STTM cells connected to the data line DL1e and the bit line BL1 are connected to a control line CL0. STTM cells connected to the data line DL1o and the bit line BL1 are connected to a control line CL1.

As stated above, each of the STTM cells is connected to a corresponding data line. One bit line (e.g., BL0) is arranged between two adjacent data lines (e.g., DL0e and DL0o). In other words, a corresponding bit line BL0 is arranged between each pair of data lines (e.g., DL0e and DL0o). When a read/write operation is performed, only one among a pair of STTM cells connected to each of the shared bit lines is selected. For example, STTM cells connected to DL0e and BL0 lines are selected when the control line CL0 becomes activated. STTM cells connected to DL0o and BL0 lines are selected when the control line CL1 becomes activated. In FIG. 1, only four data lines DL0e, DL0o, DL1e and DL1o, and two bit lines BL0 and BL1 are shown. However, as not shown in FIG. 1, the repetition of the circuit pattern shown in FIG. 1 is apparent to those skilled in the art.

Referring to FIG. 1, the non-volatile memory device 100 according to the invention further includes data line selector blocks, sense amplifier blocks, and column gate blocks. In an exemplary embodiment, two data line selector blocks 120a and 120b, two sense amplifier blocks 130a and 130b, and two column gate blocks 140a an 140b are shown in FIG. 1.

Each of the date line selector blocks 120a and 120b is configured to select one of two corresponding data lines. For example, the data line block 120a selects one of data lines DL0e and DL0o in response to control signals PIS0DLe and PIS0DLo. The data line selector block 120b selects one of data lines DL1e and DL1o also in response to control signals PIS0DLe and PIS0DLo. Each of the data line selector blocks 120a and 120b comprises two NMOS transistors M0 and M1. The NMOS transistor M0 is connected between the data line DL0e and a latch node BLSA0 and controlled by the control signal PIS0DLe. The NMOS transistor M1 is connected between the data line DL0o and a latch node BLSA0 and controlled by the control signal PIS0DLo. NMOS transistors M0 and M1 of the data line selector block 120b are connected in the same way as described for 120a, and the description thereof is thus omitted.

Each of the sense amplifier blocks 130a and 130b senses and amplifies a voltage difference between a selected bit line and a bit line related thereto. The sense amplifer blocks 130a and 130b comprise NMOS transistors M2, M3, M4, M5, M6, M9, M10 and M12, and PMOS transistors M7, M8 and M11, which are connected as shown in FIG. 1. The elements of the sense amplifier blocks 130a and 130b are denoted by the same reference numbers. For instance, during a read mode, each of the sense amplifier blocks reads data stored in a selected STTM cell through a bit line and restores the read data to the reselected STTM cell by a data line. At this time, the read data may be outputted through a corresponding column gate block to the outside. During a write mode, each sense amplifier block previously reads data stored in the selected STTM cell through a bit line. Additionally, after data to be written is loaded to a bit line, each sense amplifier block stores the data to be written to the selected STTM cell through a data line. Now, this will be more fully described hereinafter.

In an exemplary embodiment, the NMOS transistor M3 and the PMOS transistor M11 form a bias current supply part for supplying a bias current to a read transistor of the selected STTM cell during a read/write operation. The above-mentioned non-volatile memory device has an array structure and a peripheral circuit, which are suitable to well-known read/write operations, so that it may be operated at high speed.

Figure 2:
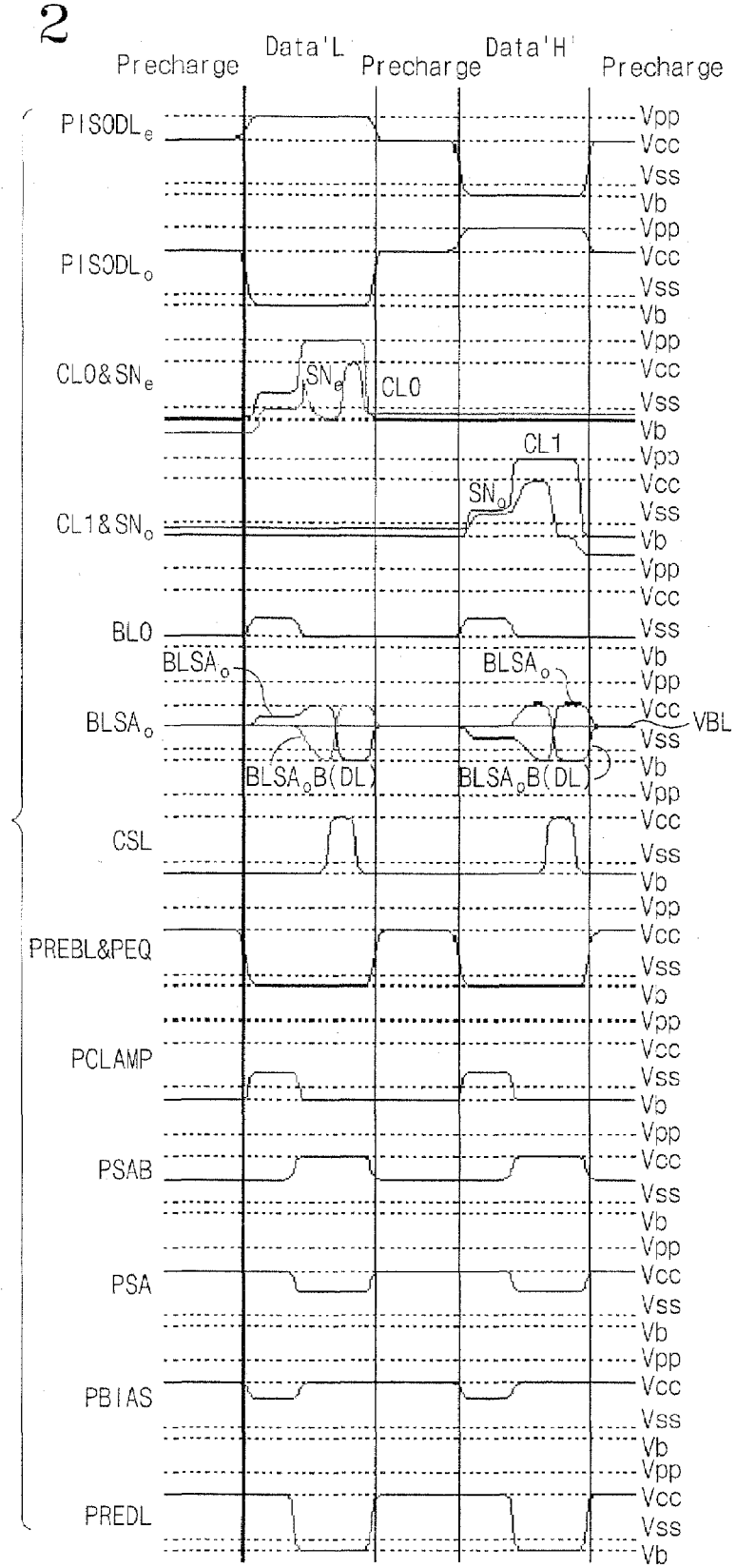
FIG. 2 is a timing diagram illustrating a write operation of the nonvolatile memory device according to the invention.

FIG. 2 is a timing diagram illustrating a write operation of the non-volatile memory device in accordance to the invention. Before explaining a write operation, here we suppose that in case data "0" is stored in a STTM cell, charges (e.g., holes) are charged in the sense node (SNe/SNo) of the STTM cell, and in case data "1" is stored in the STTM cell, charges (e.g., holes) are not charged in a sense node (SNe/SNo) of the STTM cell. Under this assumption, the write operation according to the non-volatile memory device of the invention will be more fully described hereinafter. As a matter of convenience, the write operation will be described employing a pair of STTM cells that are respectively connected to the data lines DL0e and DL0o. Also, it is apparent that the write operation of STTM cells connected to the rest of the data lines is performed similarly.

If the write operation starts, as shown in FIG. 2, the control signal PIS0DLe becomes activated to a high level at a high voltage Vpp, and on the other hand, the control signal PIS0DLo becomes inactivated to a low level at a negative voltage Vb. For this reason, the data line DL0e is connected to the latch node BLSA0 of the sense amplification block 130a by the NMOS transistor M0, and the data line DL0o is electrically insulated from the latch node BLSA0 of the sense amplification node 130a. That is, only one data line is connected to the sense amplification node. As a voltage lower than power voltage Vcc is supplied to a control line PBIAS, a bias current is supplied to the latch node BLSA0B by the PMOS transistor M11. The bias current supplied to the latch node BLSA0B is supplied to the bit line BL0 by the NMOS transistor M3. The bias current supplied to the bit line BL0 is limited by the NMOS transistor M3 according to a voltage level of a control line PCLAMP. At the same time, when a voltage between the power voltage Vcc and a ground voltage Vss is supplied to the control line CL0, a current supplied to the bit line BL0 will be selectively discharged through the read transistor N2 of a selected STTM cell in accordance with a stored data of the selected STTM. For instance, in case data "1" is stored in the selected STTM cell, the current supplied to the bit line BL0 is not discharged by the read transistor N2 of the selected STTM cell.

Since data "1" is stored in the selected STTM cell, as shown in FIG. 2, a voltage of the latch node BLSA0B becomes higher than a pre-charge voltage VBL. As the power voltage Vcc is supplied to the signal line PSAB, and a voltage lower than the power voltage Vcc is supplied to the signal line PSA, a voltage of the latch node BLSA0B becomes amplified to the power voltage Vcc, and a voltage of the latch node BLSA0 becomes amplified to the negative voltage Vb. At the same time, by activating the control signal CSL0, data to be written is transferred to the latch node BLSA0B by the NMOS transistor M13 of a column gate block 140a.

In case data to be written is "0", as shown in FIG. 2, the value of the latch nodes BLSA0B and BLSA0 becomes inversed. In other words, the voltage of the latch node BLSA0B becomes changed to the negative voltage Vb, and the voltage of the latch node BLSA0 becomes changed from the negative voltage Vb to the power voltage Vcc. Resultantly, if data to be written is "0", the power voltage Vcc is supplied to the data line DL0e. At the same time, the voltage of the control line CL0 increases to the high voltage Vpp, and the write transistor N1 of the selected STTM cell is turned on. Accordingly, charges are charged on the sense node SNe of the selected STTM cell. That is, data "0" is written by performing the above-mentioned operations.

After data "0" is written in the selected STTM cell, the control lines PIS0DLe, PSAB and PSA become a high level at the power voltage Vcc. At the same time, as shown in FIG. 2, the control signals PREBL, PEQ and PREDL become activated to a high level at the power voltage Vcc., so the bit line BL0 is pre-charged to the ground voltage Vss, and data lines DL0e and DL0o become respectively pre-charged to the VBL voltage.

The operation for storing data "1" in a STTM connected to signal lines BL0, DL0o and CL1 will be described hereinafter. As shown in FIG. 2, the control signal PIS0DLo becomes activated to a high level at the high voltage Vpp, and on the other hand, the control signal PIS0DLe becomes inactivated to a low level at the negative voltage Vb. For this reason, the data line DL0o is connected to the latch node BLSA0 of the sense amplification block 130a by the NMOS transistor M1, and the data line DL0e is electrically insulated from the latch node BLSA0 of the sense amplification block 130a. As a voltage lower than the power voltage Vcc is supplied to the control signal PBIAS, a bias current is supplied to the latch node BLSA0B by the PMOS transistor M11. The bias current supplied to the latch node BLSA0B is supplied to the bit line BL0 by the NMOS transistor M3. The bias current supplied to the bit line BL0 is limited by the NMOS transistor M3 according to a voltage level of the control line PCLAMP. At the same time, when a voltage between the power voltage Vcc and the ground voltage Vss is applied to the control line CL1, a current supplied to the bit line BL0 will be discharged through a read transistor of a selected STTM cell according to a stored data of the selected STTM cell. For example, in case data "0" is stored in the selected STTM cell, the current supplied to the bit line BL0 is discharged by the read transistor of the selected STTM cell.

Since data "0" is stored in the selected STTM cell, a voltage of the latch node BLSA0B becomes low in comparison with the pre-charge voltage VBL. Since the power voltage Vcc is supplied to the signal line PSAB, and a voltage lower than the power voltage Vcc is supplied to the signal line PSA, the voltage of the latch node BLSA0B is amplified to the negative voltage Vb, and the voltage of the latch node BLSA0 is amplified to the power voltage Vcc. At the same time, by activating the control signal CSL0, data to be written to the latch node BLSA0B is transferred by the NMOS transistor M13 of the column gate block 140a.

If the data to be written is "1", as shown in FIG. 2, the values of the latch nodes BLSA0B and BLSA0 become inversed. In other words, the voltage of the latch node BLSA0 is changed from the negative voltage Vb to the power voltage Vcc, and the voltage of the latch node BLSA0 is changed from the power voltage Vcc to the negative voltage Vb. Resultantly, if the data to be written is "1", the negative voltage Vb is supplied to the data line DL0o. At the same time, the voltage of the control line CL1 is increased to the high voltage Vpp., so that a write transistor N1 of the selected STTM cell becomes turned on. Accordingly, charges are not charged on the sense node SNo of the selected STTM cell. That is, data "1" is written to the selected STTM cell by performing the above-mentioned operations.

After the data "1" is written to the selected STTM cell, the control lines PIS0DLe, PIS0DLo, PSAB and PSA become a high level at the power voltage Vcc. At the same time, as shown in FIG. 2, the control signals PREBL, PEQ and PREDL are activated to a high level at the power voltage Vcc., so that the bit line is pre-charged to the ground voltage Vss, and the data lines DL0e and DL0o are respectively pre-charged to the VBL voltage.

Figure 3:
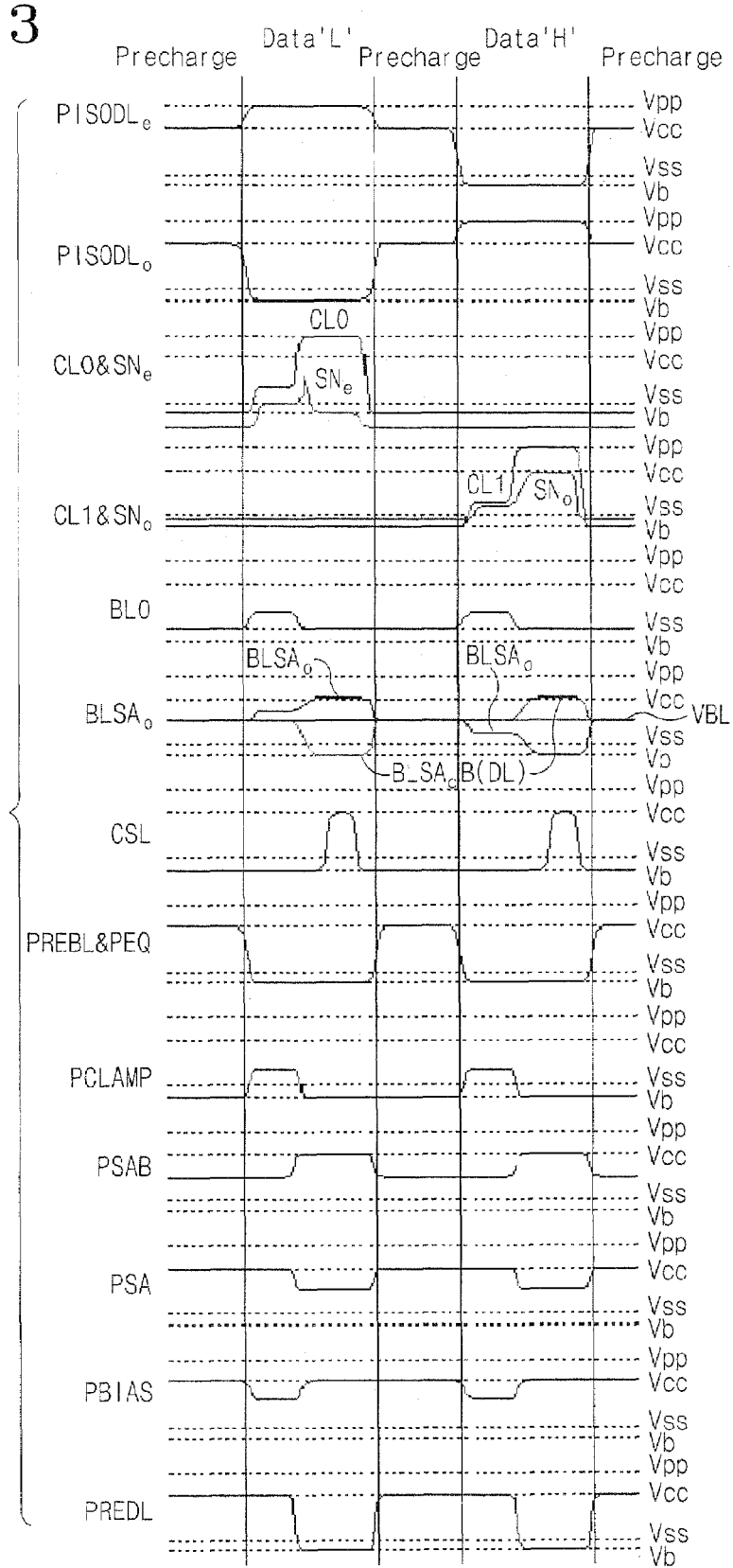
FIG. 3 is a timing diagram illustrating a read operation of the nonvolatile memory device according to the invention.

FIG. 3 is a timing diagram illustrating a read operation of the non-volatile memory device according to the invention. Before explaining a read operation, here we suppose that in case data "0" is stored in a STTM cell, charges are charged in a sense node (SNe/SNo) of the STTM cell, and in case data "1" is stored in the STTM cell, charges are not charged in the sense node (SNe/SNo) of the STTM cell. Under this assumption, the read operation according to the non-volatile memory device of the invention will be more fully described hereinafter. As a matter of convenience, the read operation will be described employing a pair of STTM cells that are respectively connected to the data lines DL0e and DL0o. Also, it is apparent that the read operation of STTM cells connected to the rest of the data lines is performed similarly.

If the read operation starts, as shown in FIG. 3, the control signal PIS0DLe becomes activated to a high level at a high voltage Vpp, and on the other hand, the control signal PIS0DLo becomes inactivated to a low level at a negative voltage Vb. For this reason, the data line DL0e is connected to the latch node BLSA0 of the sense amplification block 130a by the NMOS transistor M0, and the data line DL0o is electrically insulated from the latch node BLSA0 of the sense amplification node 130a. That is, only one data line is connected to the sense amplification node. As a voltage lower than power voltage Vcc is supplied to a control line PBIAS, a bias current is supplied to the latch node BLSA0B by the PMOS transistor M11. The bias current supplied to the latch node BLSA0B is supplied to the bit line BL0 by the NMOS transistor M3. As previously mentioned, the bias current supplied to the bit line BL0 is limited by the NMOS transistor M3. At the same time, when a voltage between the power voltage Vcc and a ground voltage Vss is supplied to the control line CL0, a current supplied to the bit line BL0 will be selectively discharged through the read transistor N2 of a selected STTM cell in accordance with a stored data of the selected STTM. For instance, in case data "1" is stored in the selected STTM cell, the current supplied to the bit line BL0 is not discharged by the read transistor of the selected STTM cell.

Since data "1" is stored in the selected STTM cell, as shown in FIG. 3, a voltage of the latch node BLSA0B becomes higher than a pre-charge voltage VBL. As the power voltage Vcc is supplied to the signal line PSAB, and a voltage lower than the power voltage Vcc is supplied to the signal line PSA, a voltage of the latch node BLSA0B becomes amplified to the power voltage Vcc, and a voltage of the latch node BLSA0 becomes amplified to the negative voltage Vb. By activating the control signal CSL0, the voltage of the latch node BLSA0B will be outputted as read data to the outside by the NMOS transistor M13 of the column gate block 140a. At the same time, the read data is restored in the selected STTM cell. For this, as shown in FIG. 3, the voltage of the control line CL0 becomes increased to the high voltage Vpp., and the write transistor N1 of the selected STTM cell is turned on. Because the negative voltage Vb is supplied to the data line DLOe, charges are not charged with the sense node SNe of the selected STTM cell. By these operations, data "1" is read, and at the same time, a restore operation is performed.

After data "1" is read from the selected STTM cell, the control lines PIS0DLe, PSAB and PSA become a high level of the power voltage Vcc. At the same time, as shown in FIG. 2, the control signals PREBL, PEQ and PREDL also become activated to a high level of the power voltage Vcc., so that the bit line BL0 is pre-charged to the ground voltage Vss, and data lines DL0e and DL0o become respectively pre-charged to the VBL voltage.

The operation for reading data "0" in a STTM connected to signal lines BL0, DL0o and CL1 will be described hereinafter. As shown in FIG. 3, the control signal PIS0DLo becomes activated to a high level at the high voltage Vpp, and on the other hand, the control signal PIS0DLe becomes inactivated to a low level at the negative voltage Vb. For this reason, the data line DL0o is connected to the latch node BLSA0 of the sense amplification block 130a by the NMOS transistor M1, and the data line DL0e is electrically insulated from the latch node BLSA0 of the sense amplification block 130a. As a voltage lower than the power voltage Vcc is supplied to the control signal PBIAS, a bias current is supplied to the latch node BLSA0B by the PMOS transistor M11. The bias current supplied to the latch node BLSA0B is supplied to the bit line BL0 by the NMOS transistor M3. At the same time, when a voltage between the power voltage Vcc and the ground voltage Vss is applied to the control line CL1, a current supplied to the bit line BL0 will be selectively discharged through the read transistor N2 of a selected STTM cell according to a stored data of the selected STTM cell. For example, in case data "0" is stored in the selected STTM cell, the current supplied to the bit line BL0 is discharged by the read transistor of the selected STTM cell.

Because data "0" is stored in the selected STTM cell, the voltage of the latch node BLSA0B becomes low in comparison with the pre-charge voltage VBL. Since the power voltage Vcc is supplied to the signal line PSAB, and a voltage lower than the power voltage Vcc is supplied to the signal line PSA, a voltage of the latch node BLSA0B becomes amplified to the power voltage Vcc, and a voltage of the latch node BLSA0 is amplified to the negative voltage Vb. By activating the control signal CSL0, the voltage of the latch node BLSA0B will be outputted as read data to the outside by the NMOS transistor M13 of the column gate block 140a. At the same time, the read data is restored in the selected STTM cell. For this, as shown shown in FIG. 3, the voltage of the control line CL0 becomes increased to the high voltage Vpp. As the voltage of the control line CL0 increases to the high voltage Vpp, the write transistor N1 of the selected STTM cell becomes turned on. Because the power voltage Vcc is supplied to the data line DLOe, charges are charged on the sense node SNe of the selected STTM cell. By previous operations, data "0" is read, and at the same time, a restore operation is performed.

After data "0" is read from the selected STTM cell, the control lines PIS0DLe, PIS0DLo, PSAB and PSA become a high level of the power voltage Vcc. At the same time, as shown in FIG. 3, the control signals PREBL, PEQ and PREDL are activated to a high level at the power voltage Vcc., so that the bit line BL0 is pre-charged to the ground voltage Vss, and the data lines DL0e and DLOo are respectively pre-charged to the VBL voltage.

Figure 4:
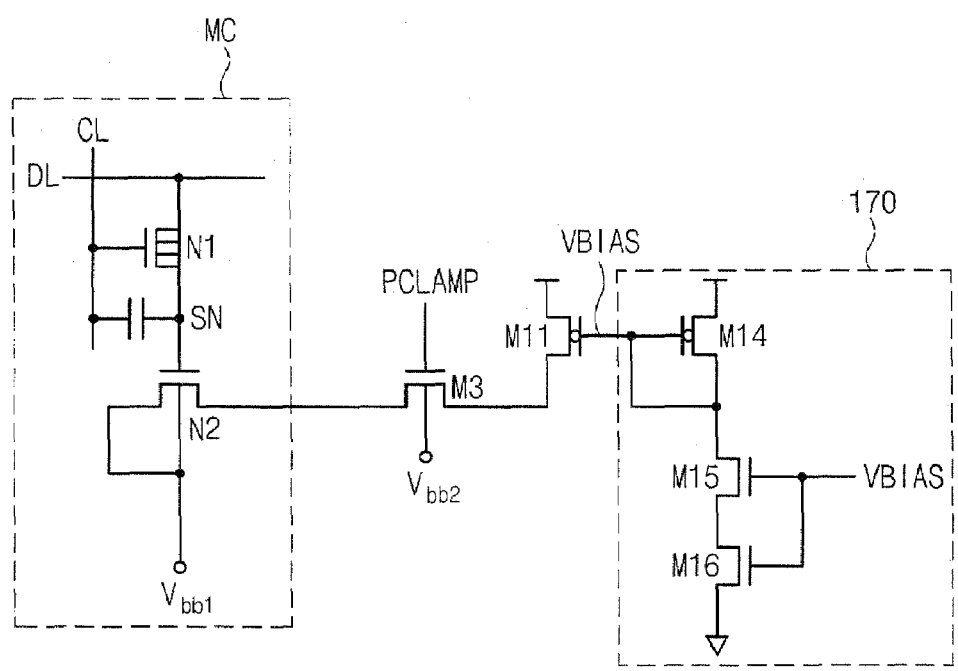
FIG. 4 shows a bulk structure used in order to measure a voltage distribution of a sense node in the nonvolatile memory device according to the invention.

FIG. 4 shows a bulk structure used to measure a voltage distribution of a sense node in the non-volatile memory device according to the invention.

As shown in FIG. 4, a bulk voltage Vbb1 of the read transistor of the STTM cell MC is different from a bulk voltage Vbb2 of the NMOS transistor M3. In other words, a bulk region of a memory cell array where STTM cells arranged is separated from a bulk region of sense amplification block where the NMOS transistor M3 is formed. The reason for this is to verify a voltage distribution of the sense node SN of the STTM cell MC. It is possible to verify the voltage distribution of the STTM cell MC by controlling a bulk-source voltage Vbs of the read transistor N2, that is, by varying the bulk voltage Vbb1 of the read transistor N2. At this time, a bias current supplied by the PMOS transistor M11 maintains constant. Another method for verifying the voltage distribution of the sense node SN of the STTM cell MC is to control a bias current by a control circuit 170 comprising the PMOS transistor M14 and the NMOS transistors M15 an M16. For instance, the voltage distribution of the sense node of the STTM cells where data "0" is stored may be verified by fixing the bulk voltage Vbb1 to 0V and varying a bias voltage VBIAS. In addition, the voltage distribution of the sense node of the STTM cells where data "1" is stored may be verified by fixing the bulk voltage Vbb1 to a voltage lower than 0V and varying the bias voltage VBIAS.

As previously mentioned, a read/write operation is possibly performed by improving an array structure, so that a non-volatile memory device operated at high speed may be embodied. In addition, it is possible to verify a charge distribution of a sense node of STTM cells by separating a bulk of a read transistor from a bulk of a sense amplification block and controlling a bulk voltage, or by controlling a bias current supplied to a read transistor.

While the invention has been disclosed in its preferred embodiments, the specific embodiments as disclosed and illustrated herein are not to be considered in a limiting sense. Indeed, it should be readily apparent to those skilled in the art in view of the description that the invention may be modified in numerous ways. The inventor regards the subject matter of the invention to include all combinations and sub-combinations of the various elements, features, functions and/or properties disclosed herein.

The following claims define certain combinations and sub-combinations, which are regarded as novel and non-obvious. Additional claims for other combinations and sub-combinations of features, functions, elements and/or properties may be presented in this or a related document.

What is claimed is:

1. A nonvolatile memory device, comprising:
   a common bit line;
   first and second data lines;
   a first group of scalable two transistor memory cells, each memory cell including a write transistor and a read transistor, the memory cells being connected in parallel with each other between the common bit line and the first data line; and
   a second group of scalable two transistor memory cells, each memory cell including a write transistor and a read transistor, the second-group memory cells being connected in parallel with each other, and all of the memory cells of the second group being between the common bit line and the second data line.

2. The nonvolatile memory device of claim 1, wherein a first group of control lines respectively are connected to the scalable two transistor memory cells of the first group, and a second group of control lines respectively are connected to the scalable two transistor memory cells of the second group, wherein the control lines of the first and second groups are alternately arranged.

3. The nonvolatile memory device of claim 1, further comprising:
   a selection circuit to select one of the first and the second data lines in response to control signals; and
   a sense amplification circuit to sense and to amplify a voltage difference between the common bit line and the selected data line.

4. The nonvolatile memory device of claim 3, wherein the sense amplification circuit senses data stored in a selected scalable two transistor memory cell and writes data to be written to the selected scalable two transistor memory cell in a write operation.

5. The nonvolatile memory device of claim 3, wherein the sense amplification circuit senses data stored in a selected scalable two transistor memory cell and outputs the sensed data to outside the nonvolatile memory device in a read operation, and
   wherein the sensed data is outputted to the outside the nonvolatile memory device, at the same time, is restored in the selected scalable two transistor memory cell.

6. The nonvolatile memory device of claim 4, wherein the sense amplification circuit supplies a bias current to the selected scalable two transistor memory cell in sensing data stored in a selected scalable two transistor memory cell.

7. The nonvolatile memory device of claim 3,
   wherein the sense amplification circuit includes a bias current supply part to supply a bias current to the selected scalable two transistor memory cell in a read/write operation.

8. The nonvolatile memory device of claim 7, wherein bulk regions of read transistors in the plurality of scalable two transistor memory cells are electrically separated from a bulk region of the bias current supply part in the sense amplification circuit.

9. The nonvolatile memory device of claim 8, wherein a sense node voltage distribution of the plurality of scalable two transistor memory cells is verified by controlling a voltage applied to bulk regions of the read transistors of the plurality of scalable two transistor memory cells.

10. A nonvolatile memory device comprising:
    a plurality of data line pairs;
    a plurality of bit lines arranged between each pair of data lines;
    a plurality of scalable two transistor memory cells, each memory cell including a write transistor and a read transistor arranged to share a bit line arranged between each pair of data lines;
    a plurality of data line selectors corresponding to each pair of the data lines, each of the data line selectors selecting one data line among a corresponding data line pair; and
    a plurality of sense amplifiers each corresponding to the data line selectors, each of the sense amplifiers sensing and amplifying a voltage difference between the selected data line and a corresponding bit line.

11. The nonvolatile memory device of claim 10, wherein scalable two transistor memory cells connected to each of the data line pairs are classified into a first group and a second group, and
    wherein scalable two transistor memory cells of the first group are respectively connected to a first group of control lines, and
    wherein scalable two transistor memory cells of the second group are respectively connected to a second group of control lines, and
    wherein the control lines of the first and second groups are alternately arranged.

12. The nonvolatile memory device of claim 10, wherein each of the sense amplifiers senses data stored in a selected scalable two transistor memory cell and then writes data to be written to the selected scalable two transistor memory cell in a write operation.

13. The nonvolatile memory device of claim 10, wherein each of the sense amplifiers senses data stored in the selected scalable two transistor memory and outputs the sensed data to outside the nonvolatile memory device, and
    wherein the sensed data is outputted to the outside the nonvolatile memory device, and at the same time, is restored in the selected scalable two transistor memory cell in a read operation.

14. The nonvolatile memory device of claim 12, wherein each of the sense amplifiers supplies a bias current to the selected scalable two transistor memory cell in sensing data stored in the selected scalable two transistor memory cell.

15. The nonvolatile memory device of claim 10, wherein each of the scalable two transistor memory cells includes a read transistor and a write transistor, and wherein each of the sense amplifiers includes a bias current supply part to supply a bias current to the selected scalable two transistor memory cell in a read/write operation.

16. The nonvolatile memory device of claim 15, wherein bulk regions of read transistors in the scalable two transistor memory cells are electrically separated from a bulk region of the bias current supply part of each of the sense amplifiers.

17. The nonvolatile memory device of claim 16, wherein a sense node voltage distribution of the scalable two transistor memory cells is verified by controlling a voltage applied to bulk regions of the read transistors of the scalable two transistor memory cells.

* * * * *